(12) United States Patent
Zhao

(10) Patent No.: US 9,391,226 B2
(45) Date of Patent: *Jul. 12, 2016

(54) SEMICONDUCTOR DC TRANSFORMER

(75) Inventor: Dongjing Zhao, Beijing (CN)

(73) Assignee: Lei Guo, Beijing (CN)

( * ) Notice: Subject to any disclaimer, the term of this patent is extended or adjusted under 35 U.S.C. 154(b) by 0 days.

This patent is subject to a terminal disclaimer.

(21) Appl. No.: 13/643,889

(22) PCT Filed: May 11, 2012

(86) PCT No.: PCT/CN2012/075393
§ 371 (c)(1),
(2), (4) Date: Oct. 26, 2012

(87) PCT Pub. No.: WO2013/067805
PCT Pub. Date: May 16, 2013

(65) Prior Publication Data
US 2013/0119409 A1    May 16, 2013

(30) Foreign Application Priority Data

Nov. 10, 2011   (CN) .......................... 2011 1 0355999
Nov. 10, 2011   (CN) .......................... 2011 1 0356005
Jan. 20, 2012   (CN) .......................... 2012 1 0020018

(51) Int. Cl.
*H01L 31/12*      (2006.01)
*H02M 3/00*      (2006.01)
*H02J 7/35*       (2006.01)

(52) U.S. Cl.
CPC ................ *H01L 31/12* (2013.01); *H02M 3/00* (2013.01); *H02J 7/35* (2013.01)

(58) Field of Classification Search
CPC ................ H01L 25/167; H01L 31/12–31/173
USPC ........................................................ 257/84
See application file for complete search history.

(56) References Cited

U.S. PATENT DOCUMENTS 3,881,113 A * 4/1975 Rideout et al. ................. 250/551
4,112,308 A * 9/1978 Olschewski et al. .......... 250/551

(Continued)

FOREIGN PATENT DOCUMENTS

CN         1625812 A       6/2005
CN       101494246 A       7/2009

(Continued)

OTHER PUBLICATIONS

International Search Report and Written Opinion for Application No. PCT/CN2012/075393 dated Aug. 23, 2012.

*Primary Examiner* — Matthew Reames
(74) *Attorney, Agent, or Firm* — David D. Brush; Westman, Champlin & Koehler, P.A.

(57) ABSTRACT

A semiconductor DC transformer is provided. The semiconductor DC transformer comprises: a plurality of semiconductor electricity-to-light conversion structures connected in series for converting input electric energy into optical energy; and a plurality of semiconductor light-to-electricity conversion structures connected in series for converting input optical energy into electric energy, in which a number of the semiconductor electricity-to-light conversion structures is different from that of the semiconductor light-to-electricity conversion structures so as to realize a DC transformation, and a working light spectrum of the semiconductor electricity-to-light conversion structures is matched with that of the semiconductor light-to-electricity conversion structures.

19 Claims, 5 Drawing Sheets

(56) References Cited

U.S. PATENT DOCUMENTS

| | | | |
|---|---|---|---|
| 4,730,115 A * | 3/1988 | Abe | 250/551 |
| 5,248,931 A * | 9/1993 | Flesner et al. | 322/2 R |
| 5,407,602 A * | 4/1995 | Cava | 252/519.1 |
| 6,130,147 A * | 10/2000 | Major et al. | 438/604 |
| 7,998,768 B1 * | 8/2011 | Horng et al. | 438/29 |
| 2005/0093659 A1 | 5/2005 | Larson et al. | |
| 2006/0006792 A1 * | 1/2006 | Strip | 313/500 |
| 2010/0006143 A1 * | 1/2010 | Welser | 136/255 |
| 2010/0218822 A1 * | 9/2010 | Yamasaki et al. | 136/256 |
| 2011/0115040 A1 | 5/2011 | Su et al. | |

FOREIGN PATENT DOCUMENTS

| | | |
|---|---|---|
| CN | 101803036 A | 8/2010 |
| CN | 101889351 A | 11/2010 |
| CN | 102005978 A | 4/2011 |
| CN | 102427094 A | 4/2012 |
| CN | 202503017 U | 10/2012 |
| JP | 56-040234 | 4/1981 |
| JP | 57-064985 | 4/1982 |
| JP | 3532966 B2 | 5/2004 |

* cited by examiner

SEMICONDUCTOR DC TRANSFORMER

CROSS-REFERENCE TO RELATED APPLICATIONS

The present application is a national phase entry under 35 U.S.C. §371 of International Application No. PCT/CN2012/075393 filed May 11, 2012, which claims priority from Chinese Patent Application No. 201110356005.4, filed Nov. 10, 2011, Chinese Patent Application No. 201110355999.8, filed Nov. 10, 2011, Chinese Patent Application No. 201210020018.9, filed Jan. 20, 2012, all of which are incorporated herein by reference.

FIELD

The present disclosure relates to current and voltage transformation field, and more particularly to a semiconductor DC (direct current) transformer.

BACKGROUND

An AC (alternating current) electric power transmission is applied to most conventional electric power systems because of a convenience of an AC voltage transformation, by using an electromagnetic field as an energy transmission medium and achieving voltage transformation, especially the transformation from a low voltage to a high voltage, according to an electromagnetic induction principle by coupling a primary coil and a secondary coil with different numbers of turns. Compared with an AC, a DC has huge advantages in terms of a transmission loss, a stability of a grid and a cost. For a DC voltage transformer, particularly for a DC voltage step-up transformer, however, a simple and efficient boosting technology and a device thereof have not been proposed for a long time. With a technology development, in one aspect, power generation technologies such as a solar cell or a fuel cell, which directly generate DC electric power, hold a larger and larger proportion to the whole electric power of the world; in another aspect, electric equipments such as LED bulbs, OLED, LED TVs, LED displays and other household electric appliances which use a DC electric power are increasing. A usual scheme of DC power generation, transmission and application, which is complex and explained as "DC power generation, conversion from DC to AC, AC transformation, AC high voltage transmission, AC transformation, conversion from AC to DC, and then DC application", has following disadvantages.

1. A required apparatus has complicated structure, numerous elements, large volume and high cost.

2. There is energy loss to different extents in each procedure, such as voltage transformation loss, current transformation loss, transmission loss, drive loss resulting from reconversion to DC at a user side, etc., thus causing low total energy transmission efficiency.

3. During a process of AC high voltage transmission, it is difficult to allow a complete synchronization of AC phases among different power generation systems, thus causing a serious stability problem of the whole power grid.

In contrast, a scheme of "DC power generation, DC transformation, DC high voltage transmission, DC transformation, and then DC application" is simpler, more stable, and more reliable, and has less energy loss. In order to popularize the DC power generation and transmission, developments of DC transformation technologies and DC transformers are becoming a focus.

SUMMARY

The present disclosure is aimed to solve at least one of the problems. Accordingly, a semiconductor DC transformer is provided.

According to an embodiment of the present disclosure, a semiconductor DC transformer is provided. The semiconductor DC transformer comprises: a plurality of semiconductor electricity-to-light conversion structures connected in series for converting input electric energy into optical energy; and a plurality of semiconductor light-to-electricity conversion structures connected in series for converting input optical energy into electric energy, in which a number of the semiconductor electricity-to-light conversion structures is different from that of the semiconductor light-to-electricity conversion structures so as to realize a DC transformation, and a working light spectrum of the semiconductor electricity-to-light conversion structures is matched with that of the semiconductor light-to-electricity conversion structures.

In one embodiment, each semiconductor electricity-to-light conversion structure comprises a light emitting diode structure, a resonant cavity light emitting diode structure, or a laser diode structure.

In one embodiment, each semiconductor light-to-electricity conversion structure is a photovoltaic cell structure having a back contact or a buried contact, with positive and negative electrodes led out from a same surface of the photovoltaic cell structure.

In one embodiment, each semiconductor electricity-to-light conversion structure comprises a plurality of semiconductor electricity-to-light conversion units connected in parallel, or each semiconductor light-to-electricity conversion structure comprises a plurality of semiconductor light-to-electricity conversion units connected in parallel.

In one embodiment, the semiconductor DC transformer further comprises an insulation layer, in which the plurality of semiconductor electricity-to-light conversion structures are formed on one side of the insulation layer, each semiconductor electricity-to-light conversion structure comprises an electricity-to-light conversion layer, the plurality of semiconductor light-to-electricity conversion structures are formed on the other side of the insulation layer, each semiconductor light-to-electricity conversion structure comprises an light-to-electricity conversion layer, and the insulation layer is transparent to a working light emitted by the electricity-to-light conversion layer.

In one embodiment, refractive indices of materials of each semiconductor electricity-to-light conversion structure, the insulation layer and each semiconductor light-to-electricity conversion structure are matched with each other.

In one embodiment, refractive indices of materials of each semiconductor electricity-to-light conversion structure, the insulation layer and each semiconductor light-to-electricity conversion structure are approximate; or the refractive indices of materials from each semiconductor electricity-to-light conversion structure to the insulation layer and to each semiconductor light-to-electricity conversion structure are increased.

In one embodiment, at least one of each semiconductor electricity-to-light conversion structure, the insulation layer and each semiconductor light-to-electricity conversion structure has a roughened surface, a patterned surface or a photonic crystal structure.

In one embodiment, the semiconductor DC transformer further comprises: a first contact layer located on a top of each electricity-to-light conversion layer, a second contact layer located on a bottom of each electricity-to-light conversion layer, a third contact layer located on a top of each light-to-electricity conversion layer, and a fourth contact layer located on a bottom of each light-to-electricity conversion layer, in which the second contact layer and the fourth contact layer are transparent to the working light emitted by the electricity-to-light conversion layer.

In one embodiment, a material of each of the second contact layer and the fourth contact layer comprises any one of a heavily doped semiconductor material, a transparent conductive oxide, graphene and a combination thereof.

In one embodiment, the semiconductor DC transformer further comprises: a first reflection layer located between each electricity-to-light conversion layer and the first contact layer, and a second reflection layer located between each light-to-electricity conversion layer and the third contact layer; or a third reflection layer located on a top of the first contact layer, and a fourth reflection layer located on a top of the third contact layer.

In one embodiment, the semiconductor DC transformer further comprises: a fifth contact layer located on each side of each electricity-to-light conversion layer; and a sixth contact layer located on each side of each light-to-electricity conversion layer.

In one embodiment, the semiconductor DC transformer further comprises: a fifth reflection layer located on the top of each electricity-to-light conversion layer; and a sixth reflection layer located on the top of each light-to-electricity conversion layer.

In one embodiment, the semiconductor DC transformer further comprises a substrate layer, in which the plurality of semiconductor light-to-electricity conversion structures and the plurality of semiconductor electricity-to-light conversion structures are formed on the substrate layer, each semiconductor light-to-electricity conversion structure has a light-to-electricity conversion layer, each semiconductor electricity-to-light conversion structure has an electricity-to-light conversion layer, and an insulating transparent dielectric is filled between the plurality of semiconductor light-to-electricity conversion structures and the plurality of semiconductor electricity-to-light conversion structures.

In one embodiment, a triangular reflection structure is disposed in a lower part of the substrate layer.

In one embodiment, the semiconductor DC transformer further comprises: a seventh contact layer located on a top of each electricity-to-light conversion layer, an eighth contact layer located on a bottom of each electricity-to-light conversion layer, a ninth contact layer located on a top of each light-to-electricity conversion layer, and a tenth contact layer located on a bottom of each light-to-electricity conversion layer, in which the eighth contact layer and the tenth contact layer are transparent to the working light emitted by the electricity-to-light conversion layer.

In one embodiment, a material of each of the eighth contact layer and the tenth contact layer comprises any one of a heavily doped semiconductor material, a transparent conductive oxide, graphene and a combination thereof.

In one embodiment, the semiconductor DC transformer further comprises: a seventh reflection layer located between each electricity-to-light conversion layer and the seventh contact layer and between each light-to-electricity conversion layer and the ninth contact layer, and an eighth reflection layer located between each electricity-to-light conversion layer and the eighth contact layer and between each light-to-electricity conversion layer and the tenth contact layer; or a ninth reflection layer located on tops of the seventh contact layer and the ninth contact layer, and a tenth reflection layer located on bottoms of the eighth contact layer and the tenth contact layer.

In one embodiment, the semiconductor DC transformer further comprises: an eleventh contact layer formed on each side of each electricity-to-light conversion layer; and a twelfth contact layer formed on each side of each light-to-electricity conversion layer.

In one embodiment, a material of the electricity-to-light conversion layer is a nitride compound, an arsenide compound or a phosphide compound semiconductor material in groups III-V, for example, any one of AlGaInP in a red-to-yellow wavelength range; GaN and InGaN in an ultraviolet wavelength range; InGaN, AlGaInN, and ZnO in a blue-to-violet wavelength range; AlGaInAs, GaAS, InGaAs, InGaAsP, AlGaAs, and InGaAsNSb in a red wavelength range or an infrared wavelength range; and a combination thereof.

In one embodiment, a material of the light-to-electricity conversion layer comprises any one of Si, Ge, SiGe, AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials, and a combination thereof.

In one embodiment, the semiconductor DC transformer further comprises a shell, in which the plurality of semiconductor light-to-electricity conversion structures and the plurality of semiconductor electricity-to-light conversion structures are formed on two inner opposite surfaces of the shell respectively, and a liquid transparent insulating dielectric or a gaseous transparent insulating dielectric is filled in the shell.

In one embodiment, each semiconductor light-to-electricity conversion structure or each semiconductor electricity-to-light conversion structure is a quantum dot, an organic light emitting device or a photovoltaic cell.

With the semiconductor DC transformer according to an embodiment of the present disclosure, by disposing the electricity-to-light conversion layer at an input end of the semiconductor DC transformer and making use of light radiations generated by energy level transitions of electrons, DC electricity is converted into a light for transmission; and by disposing the light-to-electricity conversion layer at an output end of the semiconductor DC transformer, the light is converted into the DC electricity for outputting. Moreover, because unit voltages of the input end and the output end are dependent on material characteristic parameters of the electricity-to-light conversion layer in the electricity-to-light conversion structure and the light-to-electricity conversion layer in the light-to-electricity conversion structure respectively, if different numbers of electricity-to-light conversion structures and light-to-electricity conversion structures are connected in series at the input end and the output end respectively, a DC voltage transformation may be realized by a number ratio of the electricity-to-light conversion structures to the light-to-electricity conversion structures. In addition, the semiconductor DC transformer further has advantages of high voltage withstand, non-electromagnetic radiation, non-coil structure, safety and reliability, small volume, long lifetime, light weight, convenient installation and maintenance, etc.

Additional aspects and advantages of the embodiments of the present disclosure will be given in part in the following descriptions, become apparent in part from the following descriptions, or be learned from the practice of the embodiments of the present disclosure.

BRIEF DESCRIPTION OF THE DRAWINGS

These and other aspects and advantages of the disclosure will become apparent and more readily appreciated from the following descriptions taken in conjunction with the drawings in which.

DETAILED DESCRIPTION

Figure 1:
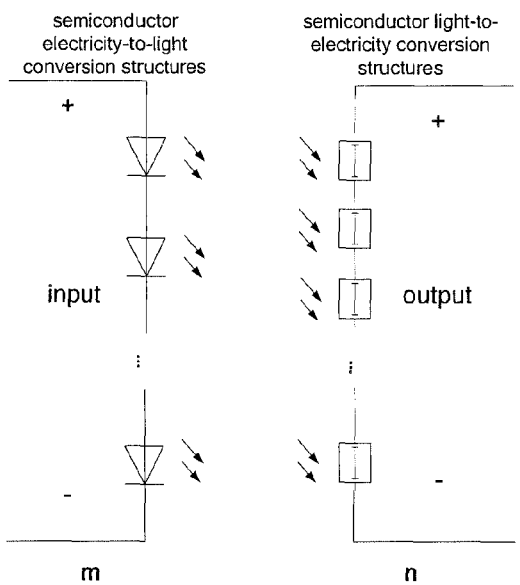
FIG. 1 is a schematic working principle diagram of a semiconductor DC transformer according to an embodiment of the present disclosure.

Embodiments of the present disclosure will be described in detail in the following descriptions, examples of which are shown in the accompanying drawings, in which the same or similar units and units having same or similar functions are denoted by like reference numerals throughout the descriptions. The embodiments described herein with reference to the accompanying drawings are explanatory and illustrative, which are used to generally understand the present disclosure. The embodiments shall not be construed to limit the present disclosure.

Various embodiments and examples are provided in the following description to implement different structures of the present disclosure. In order to simplify the present disclosure, certain elements and settings will be described. However, these elements and settings are only examples and are not intended to limit the present disclosure. In addition, reference numerals may be repeated in different examples in the disclosure. This repeating is for the purpose of simplification and clarity and does not refer to relations between different embodiments and/or settings. Furthermore, examples of different processes and materials are provided in the present disclosure. However, it would be appreciated by those skilled in the art that other processes and/or materials may be also applied. Moreover, a structure in which a first feature is "on" a second feature may include an embodiment in which the first feature directly contacts the second feature and may include an embodiment in which an additional feature is prepared between the first feature and the second feature so that the first feature does not directly contact the second feature.

According to an embodiment of the present disclosure, a semiconductor DC transformer is provided. A working principle of the semiconductor DC transformer may be shown in FIG. 1. A DC voltage $V_1$ is input to each semiconductor electricity-to-light conversion structure at an input end so as to inject carriers in each semiconductor electricity-to-light conversion structure for recombination to generate photons. The photons are transmitted to each semiconductor light-to-electricity conversion structure so as to excite in each semiconductor light-to-electricity conversion structure to generate non-equilibrium carriers, and consequently a DC voltage $V_2$ is output from each semiconductor light-to-electricity conversion structure by an internal electric field separation, thus realizing an energy transmission via light. It should be noted that a working light spectrum of the semiconductor electricity-to-light conversion structures should be matched with that of the semiconductor light-to-electricity conversion structures. During an energy transmission process, in one aspect, $V_1$ and $V_2$ are dependent on material characteristic parameters, such as a material type, a strain characteristic, a bandgap or a doping concentration, of the electricity-to-light conversion structures and the light-to-electricity conversion structures respectively so as to realize an optimization of an energy transmission efficiency by adjusting a corresponding characteristic parameter; in another aspect, by disposing different numbers of semiconductor electricity-to-light conversion structures and semiconductor light-to-electricity conversion structures connected in series at the input end and the output end respectively, a DC transformation may be realized by a number ratio of the electricity-to-light conversion structures to the light-to-electricity conversion structures. For example, assuming that the number of the electricity-to-light conversion structures is m, and the number of the light-to-electricity conversion structures is n, total output voltage/total input voltage=$(n*V_2)/(m*V_1)$.

The fact that the working light spectrum of the semiconductor electricity-to-light conversion structures is matched with that of the semiconductor light-to-electricity conversion structures means that a characteristic of a light emitted by the semiconductor electricity-to-light conversion structures is matched with that of a light with optimized light-to-electricity conversion efficiency of the semiconductor light-to-electricity conversion structures so as to increase an energy conversion efficiency of the semiconductor DC transformer and reduce energy loss in a transformation process. Specifically, a wavelength of a light emitted by a semiconductor electricity-to-light conversion unit is primarily dependent on a bandgap of a semiconductor material of its active region, and an energy hv of a single photon generated by the semiconductor electricity-to-light conversion unit equals to its bandgap $E_{g1}$. A wavelength of a light absorbed by a semiconductor light-to-electricity conversion unit is also dependent on a bandgap of a semiconductor material of its active layer. Only when the energy hv of the single photon is larger than or equal to the bandgap $E_{g2}$ of the semiconductor material of the active layer, an optoelectronic effect can happen and carrier pairs are excited out. Generally, however, because one photon may merely excite one electron-hole pair, if the energy hv of the photon is larger than the bandgap $E_{g2}$, the excess energy will be converted into a heat energy to be lost, thus causing a waste of the photon energy. Therefore, from the viewpoint of the transmission and conversion efficiency of a light energy, the photon energy of the light emitted by the semiconductor electricity-to-light conversion unit should be just absorbed by the light-to-electricity conversion unit, but should not be much larger than the bandgap $E_{g2}$ to cause energy waste. In other words, the bandgap $E_{g1}$ of the active region of the electricity-to-light conversion unit should be equal to or slightly larger than the bandgap $E_{g2}$ of the light-to-electricity conversion unit.

In one embodiment, each semiconductor electricity-to-light conversion structure comprises a light emitting diode (LED) structure, a resonant cavity light emitting diode (RC-LED) structure, or a laser diode (LD) structure, each of which may effectively convert the electric energy into the light energy with a stable and reliable working performance and less thermal effect. Moreover, the RC-LED further has advantages of a good directivity and a higher modulation speed, while the LD further has advantages of a good monochromaticity and a higher brightness.

In one embodiment, each semiconductor light-to-electricity conversion structure is a photovoltaic cell structure having a back contact or a buried contact, with positive and negative electrodes led out from a same surface of the photovoltaic cell structure, which may prevent an illuminated surface of the photovoltaic cell structure from being shaded by the electrodes so as to increase the energy conversion efficiency. Moreover, the illuminated surface looks more uniform and beautiful, an assembly difficulty may be reduced, and an assembly density may be increased.

In one embodiment, each semiconductor light-to-electricity conversion structure or each semiconductor electricity-to-light conversion structure may be a quantum dot, an organic light emitting device or a photovoltaic cell.

Figure 2:
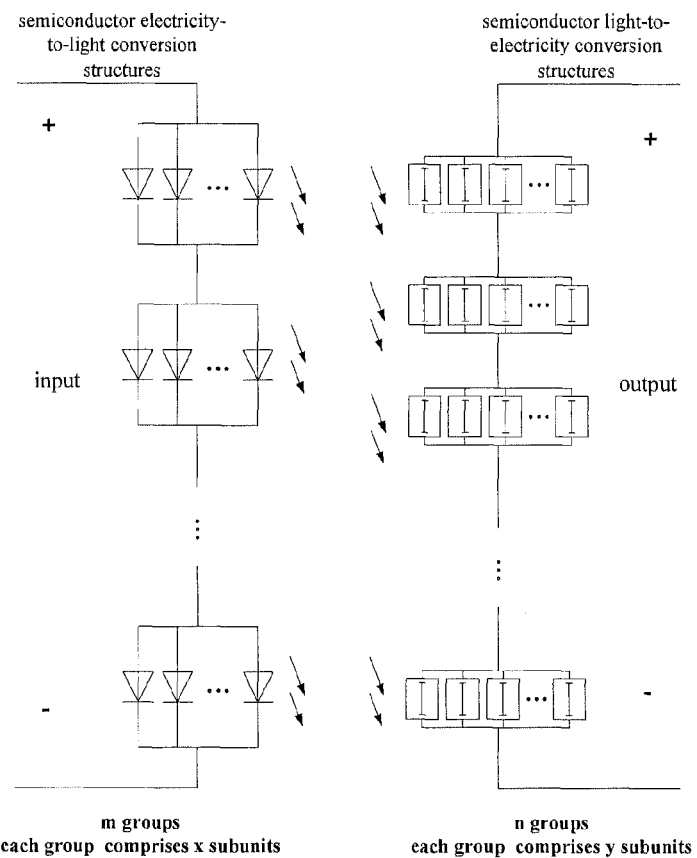
FIG. 2 is a schematic working principle diagram of a semiconductor DC transformer having a plurality of units connected in parallel according to an embodiment of the present disclosure.

In one embodiment, one single semiconductor electricity-to-light conversion structure or one single semiconductor light-to-electricity conversion structure with large area may be divided into a plurality of units with small area which may be then connected in parallel by a planar metallization interconnection process to reduce parasitic resistance, thus reducing the energy loss of the semiconductor DC transformer during the energy transmission process. As shown in FIG. 2, the input end comprises m groups of semiconductor electricity-to-light conversion structures, each group of semiconductor electricity-to-light conversion structures comprising x semiconductor electricity-to-light conversion units; and the output end comprises n groups of semiconductor light-to-electricity conversion structures, each group of semiconductor light-to-electricity conversion structures comprising y semiconductor light-to-electricity conversion units.

A "DC 220V-DC 10 KV" semiconductor DC transformer is taken as an example to illustrate a working process of the semiconductor DC transformer. During the transformation process, 100 AlGaInP based LEDs with a threshold voltage of 2.2V connected in series are selected as the plurality of semiconductor electricity-to-light conversion structures at the input end, and 5000 AlGaInP based photovoltaic cells with a photo voltage of 2V connected in series are selected as the plurality of semiconductor light-to-electricity conversion structures at the output end. Each AlGaInP based LED may emit a yellow light with a wavelength of about 560 nm when powered on, and each AlGaInP based photovoltaic cell absorbs the yellow light and converts the yellow light into the electric energy for outputting. In addition, for convenient production and assembly, a standardized component is usually made, that is, the plurality of semiconductor electricity-to-light conversion structures and the plurality of semiconductor light-to-electricity conversion structures with standard sizes are made respectively. In order to lower the energy loss caused by light leakage, a total irradiance area of electricity-to-light conversion of the plurality of semiconductor electricity-to-light conversion structures usually should be equal to a total light absorption area of light-to-electricity conversion of the plurality of semiconductor light-to-electricity conversion structures. In this example, since the number ratio of the semiconductor electricity-to-light conversion structures to the semiconductor light-to-electricity conversion structures is 100:5000, a number ratio of the LEDs to the photovoltaic cells should be 1:50, and consequently a ratio of an irradiance area of a single LED to a light absorption area of a single photovoltaic cell is 50:1. In this case, the irradiance area of a single LED should be larger. Preferably, the single LED with a large irradiance area may be replaced by a plurality of LEDs with the same threshold voltage and a small irradiance area. In one aspect, it is easy for fabrication of a device with a small area; in another aspect, it is favorable for reduction of the parasitic resistance.

The semiconductor DC transformer according to an embodiment of the present disclosure will be described with reference to the drawings.

Figure 3:
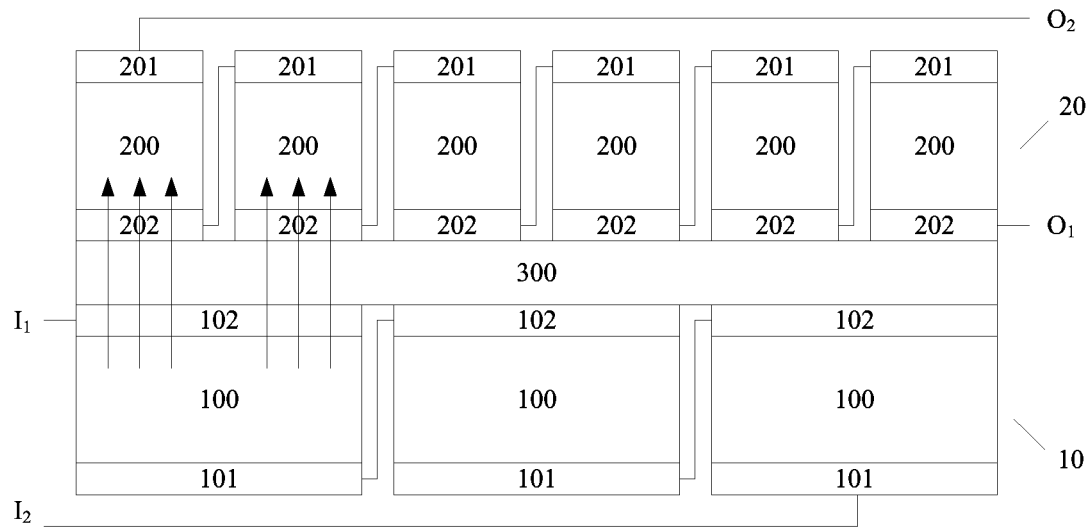
FIG. 3 is a cross-sectional view of a semiconductor DC transformer according to an embodiment of the present disclosure.

FIG. 3 is a cross-sectional view of a semiconductor DC transformer according to an embodiment of the present disclosure.

As shown in FIG. 3, the semiconductor DC transformer 1 comprises a plurality of semiconductor electricity-to-light conversion structures 10 connected in series, a plurality of semiconductor light-to-electricity conversion structures 20 connected in series and an insulation layer 300. In this embodiment, the semiconductor DC transformer 1 comprises 3 semiconductor electricity-to-light conversion structures 10 connected in series and 6 semiconductor light-to-electricity conversion structures 20 connected in series. It should be noted that "3" and "6" are merely for the convenience of illustration, but shall not be construed to limit the present disclosure. The working light spectrum of the semiconductor electricity-to-light conversion structures 10 is matched with that of the semiconductor light-to-electricity conversion structures 20, and the insulation layer 300 is transparent to the working light.

The insulation layer 300 is located between the plurality of semiconductor electricity-to-light conversion structures 10 connected in series and the plurality of semiconductor light-to-electricity conversion structures 20 connected in series. For the convenience of illustration, portions of each semiconductor electricity-to-light conversion structure 10 and each semiconductor light-to-electricity conversion structure 20 which are adjacent to the insulation layer 300 are referred to as bottoms of each semiconductor electricity-to-light conversion structure 10 and each semiconductor light-to-electricity conversion structure 20 respectively, and the opposite portions of each semiconductor electricity-to-light conversion structure 10 and each semiconductor light-to-electricity conversion structure 20 are referred to as tops of each semiconductor electricity-to-light conversion structure 10 and each semiconductor light-to-electricity conversion structure 20 respectively.

An electric energy is input to the plurality of semiconductor electricity-to-light conversion structures 10 connected in series via a lead wire 11 and a lead wire 12 to emit the working light. In a vertical direction, each semiconductor electricity-to-light conversion structure 10 comprises an electricity-to-light conversion layer 100 for converting energy, a first contact layer 101 located on a top of each electricity-to-light conversion layer 100, and a second contact layer 102 located on a bottom of each electricity-to-light conversion layer 100. Each second contact layer 102 is transparent to the working light emitted by the electricity-to-light conversion layer 100.

Moreover, the plurality of semiconductor electricity-to-light conversion structures 10 are connected in series by connecting the first contact layer 101 and the second contact layer 102 in succession. Each electricity-to-light conversion layer 100 is used for converting the input DC electricity into the light, thus emitting the working light in a required wavelength range. The working light comprises one or more wave bands in a whole spectral range ranging from an ultraviolet light of 100 nm to an infrared light of 100 μm. A single frequency light, such as a red light of 620 nm, a blue light of 460 nm or a violet light of 380 nm, is preferred to fabricate the electricity-to-light conversion layer by a mature prior art. For example, a structure and a material with high quantum efficiency and high electricity-to-light conversion efficiency may be used for forming the electricity-to-light conversion layer 100. Specifically, the structure with high quantum efficiency and high electricity-to-light conversion efficiency may be a LED structure or a laser structure generally including an active layer, a cladding layer, a current spreading layer, a PN junction, etc, in which the active layer may be a multi-quantum well structure. The electricity-to-light conversion layer with the laser structure may further comprise a resonant cavity, and the electricity-to-light conversion layer with the LED structure may further comprise a resonant cavity LED structure. A material of each electricity-to-light conversion layer 100 may be selected based on material characteristics (such as defect density, or energy band structure) and required light wave characteristics (such as wavelength range). For example, the material of each electricity-to-light conversion layer 100 comprises any one of AlGaInP in a red-to-yellow wavelength range; GaN and InGaN in an ultraviolet wavelength range; InGaN, AlGaInN, and ZnO in a blue-to-violet wavelength range; AlGaInAs, GaAS, InGaAs, InGaAsP, AlGaAs, and InGaAsNSb in a red wavelength range or an infrared wavelength range; other group III nitride compounds, group III arsenide compounds or phosphide compounds; and a combination thereof, in which the material with low defect density and high light conversion efficiency (such as AlGaInP, InGaN, or GaN) is preferred. Because each first contact layer 101 is not required to be transparent to the working light, each first contact layer 101 may be a single layer and/or a multi-layer composite structure formed by a metal, an alloy, a conductive oxide, a heavily doped semiconductor, etc., in which a low resistance metal such as Cu is preferred. More preferably, a thickness of a metal electrode layer may be increased to reduce the resistance and be favorable for heat dissipation. Because each second contact layer 102 is transparent to the working light emitted by each electricity-to-light conversion layer 100, a bandgap of a material of each second contact layer 102 should be larger than the photon energy of the working light emitted by each electricity-to-light conversion layer 100 so as to prevent each second contact layer 102 from absorbing the working light, thus improving the light wave conversion efficiency. Generally, the material of each second contact layer 102 may be any one of a heavily doped and wide bandgap semiconductor material, for example, GaAs, GaN, AlGaInP, AlGaInN, or AlGaInAs which is transparent to the working light; a conductive transparent metal oxide, for example, ITO, $SnO_2$, or ZnO; graphene; and a combination thereof.

The plurality of semiconductor light-to-electricity conversion structures 20 connected in series are used for receiving the working light and outputting the electric energy via a lead wire O1 and a lead wire O2. In the vertical direction, each semiconductor light-to-electricity conversion structure 20 comprises an light-to-electricity conversion layer 200 for converting energy, a third contact layer 201 located on a top of each light-to-electricity conversion layer 200, and a fourth contact layer 202 located on a bottom of each light-to-electricity conversion layer 200. Each fourth contact layer 202 is transparent to the working light emitted by the electricity-to-light conversion layer 100. Moreover, the plurality of semiconductor light-to-electricity conversion structures 20 are connected in series by connecting the third contact layer 201 and the fourth contact layer 202 in succession. Each light-to-electricity conversion layer 200 is used for converting the light into the electricity to realize the transformation. A material of each light-to-electricity conversion layer 200 comprises any one of Si, Ge, SiGe, AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials, and a combination thereof. It should be noted that an energy band structure of each electricity-to-light conversion layer 100 should be matched with that of each light-to-electricity conversion layer 200, so as to allow the wave band of the working light emitted by each electricity-to-light conversion layer 100 to be matched with a wave band with a maximum absorption efficiency of each light-to-electricity conversion layer 200, to achieve a maximum light wave energy conversion efficiency. Because each third contact layer 201 is not required to be transparent to the working light, each third contact layer 201 may be a single layer and/or a multi-layer composite structure formed by a metal, an alloy, a conductive oxide, a heavily doped semiconductor, etc., in which a low resistance metal such as Cu is preferred. More preferably, a thickness of a metal electrode layer may be increased to reduce the resistance and be favorable for heat dissipation. Because each fourth contact layer 202 is transparent to the working light emitted by each electricity-to-light conversion layer 100, a bandgap of a material of each fourth contact layer 202 should be larger than the photon energy of the working light emitted by each electricity-to-light conversion layer 100 so as to prevent the fourth contact layer 202 from absorbing the working light, thus improving the light wave conversion efficiency. Generally, a material of the fourth contact layer 202 may be and any one of a heavily doped and wide bandgap semiconductor material, for example, GaAs, GaN, AlGaInP, AlGaInN, or AlGaInAs which is transparent to the working light; a conductive transparent metal oxide, for example, ITO, $SnO_2$, or ZnO; graphene; and a combination thereof.

The insulation layer 300 is used for achieving an electrical isolation between the plurality of semiconductor electricity-to-light conversion structures 10 and the plurality of semiconductor light-to-electricity conversion structures 20 to allow an input voltage and an output voltage not to influence each other. Moreover, the insulation layer 300 is transparent to the working light, to allow a light carrying energy to be transmitted from each semiconductor electricity-to-light conversion structure 10 to each semiconductor light-to-electricity conversion structure 20, thus realizing the energy transmission and eventually realizing a voltage transformation. A thickness of the insulation layer 300 is dependent on the input and output voltages and an insulating requirement. The thicker the insulation layer 300, the better the insulating effect is, the higher the breakdown voltage which the insulation layer 300 may bear is, however, the larger the attenuation to the light is. Therefore, a determining principle of the thickness of the insulation layer 300 is that the thinner the better under the conditions where the insulating requirement is met. According to the above requirement, in this embodiment, a material of the insulation layer 300 may be a solid transparent insulating dielectric, for example, any one of $Al_2O_3$, AlN, $SiO_2$, MgO, $Si_3N_4$, BN, diamond, $LiAlO_2$, $LiGaO_2$, GaAs, SiC, TiO$_2$, ZrO$_2$, SrTiO$_3$, Ga$_2$O$_3$, ZnS, SiC, MgAl$_2$O$_4$, LiNbO$_3$, LiTaO$_3$, yttrium aluminium garnet (YAG) crystal, KNbO$_3$, LiF, MgF$_2$, BaF$_2$, GaF$_2$, LaF$_3$, BeO, GaP, GaN, a rare earth oxide (REO), and a combination thereof, and also may be any one of a liquid transparent insulating dielectric such as pure water, for example, CCl$_4$ or CS$_2$; or a gaseous transparent insulating dielectric such as SF$_6$, which is filled in a shell.

In addition, in order to obtain a good light-to-electricity energy conversion efficiency, a total reflection occurring at each interface during a light transmission process from each electricity-to-light conversion layer 100 to each light-to-electricity conversion layer 200 should be avoided. Because the total reflection occurs if and only if a light enters from a material with a larger refractive index to a material with a smaller refractive index, an occurrence of the total reflection may be avoided merely by properly matching the refractive index of each layer of material in a direction of light transmission. In some embodiments, the refractive indices of materials of each second contact layer 102, the insulation layer 300, each fourth contact layer 202 and each light-to-electricity conversion layer 200 may be matched with the refractive index of the material of each electricity-to-light conversion layer 100, i.e., refractive index match, to avoid the total reflection occurring at each interface during the light transmission process. Here, so called "refractive index match" means satisfying a condition: $n_{each\ electricity\text{-}to\text{-}light\ conversion\ layer} \leq n_{each\ second\ contact\ layer} \leq n_{the\ insulation\ layer} \leq n_{each\ fourth\ contact\ layer} \leq n_{each\ light\text{-}to\text{-}electricity\ conversion\ layer}$ (n is a refractive index). In one embodiment, refractive indices of materials of each electricity-to-light conversion layer 100, each second contact layer 102, the insulation layer 300, each fourth contact layer 202 and each light-to-electricity conversion layer 200 are approximately equal. In one preferred embodiment, the refractive indices of materials of each electricity-to-light conversion layer 100, each second contact layer 102, the insulation layer 300, each fourth contact layer 202 and each light-to-electricity conversion layer 200 are increased sequentially, that is, $n_{each\ electricity\text{-}to\text{-}light\ conversion\ layer} < n_{each\ second\ contact\ layer} < n_{the\ insulation\ layer} < n_{each\ fourth\ contact\ layer} < n_{each\ light\text{-}to\text{-}electricity\ conversion\ layer}$ (n is a refractive index).

In addition, different material layers may have roughened surfaces, patterned surfaces or photonic crystal structures so as to reduce the total reflection. In one preferred embodiment, at least one of each electricity-to-light conversion layer 100, each second contact layer 102, the insulation layer 300, each fourth contact layer 202 and each light-to-electricity conversion layer 200 has a roughened surface, a patterned surface or a photonic crystal structure to increase a transmittance of light and decrease the total reflection of light.

In one embodiment, each semiconductor electricity-to-light conversion structure 10 may be a multi-junction structure which may emit a plurality of groups of working lights, and each semiconductor light-to-electricity conversion structure 20 may also be a multi-junction structure which may absorb the plurality of groups of working lights and convert them into the electric energy. Specifically, a light in a specific wave band is generally emitted when the electric energy is converted into the light energy by each semiconductor electricity-to-light conversion structure 10. For example, working lights in red and yellow wave bands are mainly emitted by a LED of an (Al$_x$Ga$_{1-x}$)$_y$In$_{1-y}$P (where 0<x<1, 0<y<1) material, a working light in a green or blue wave band is emitted by a LED of an In$_x$Ga$_{1-x}$N (where 0<x<1) material, and a working light in an ultraviolet wave band is emitted by a LED of an Al$_x$Ga$_{1-x}$N or Al$_x$Ga$_y$In$_{1-x-y}$N (where 0<x<1, 0<y<1) material. Similarly, a light in a specific wave band is generally absorbed by a specific material of each semiconductor light-to-electricity conversion structure 20. For example, a visible light and an infrared light are obviously absorbed by a Si based photovoltaic cell, and a visible light in a specific wave band is absorbed by a group III-V photovoltaic cell. In order to improve the energy conversion efficiency, both each semiconductor electricity-to-light conversion structure 10 and each semiconductor light-to-electricity conversion structure 20 may be the multi-junction structure, that is, the semiconductor DC transformer 1 may consist of a plurality of multi-junction semiconductor electricity-to-light conversion structures 10 emitting the plurality of groups of working lights and a plurality of multi-junction semiconductor light-to-electricity conversion structures 20 absorbing the plurality of groups of working lights, provided that the plurality of groups of working lights emitted by the plurality of multi-junction semiconductor electricity-to-light conversion structures 10 are matched with the plurality of groups of working lights absorbed by the plurality of multi-junction semiconductor light-to-electricity conversion structures 20. The multi-junction structure may increase the energy conversion efficiency when properly matching the working light spectra.

In one embodiment, the semiconductor DC transformer 1 further comprises a plurality of diodes which are connected with the plurality of semiconductor electricity-to-light conversion structures 10 and the plurality of semiconductor light-to-electricity conversion structures 20 respectively. When a current in a circuit is too large, the plurality of diodes will be broken down firstly, thus protecting each semiconductor electricity-to-light conversion structure 10 and each semiconductor light-to-electricity conversion structure 20.

It should be noted that in the above embodiments, the plurality of semiconductor electricity-to-light conversion structures 10 may be located on the insulation layer 300, while the plurality of semiconductor light-to-electricity conversion structures 20 may be located below the insulation layer 300, however, in other embodiments, the plurality of semiconductor electricity-to-light conversion structures 10 may be located below the insulation layer 300, while the plurality of semiconductor light-to-electricity conversion structures 20 may be located on the insulation layer 300. A change of relative position relationship will not cause a substantial influence on a work of the semiconductor DC transformer.

With the semiconductor DC transformer according to an embodiment of the present disclosure, by disposing the electricity-to-light conversion layer at an input end of the semiconductor DC transformer and making use of light radiations generated by energy level transitions of semiconductor electrons, DC electricity is converted into a light for transmission; and by disposing the light-to-electricity conversion layer at an output end of the semiconductor DC transformer, the light is converted into the DC electricity for outputting. Moreover, because unit voltages of the input end and the output end are dependent on material characteristic parameters of the electricity-to-light conversion layer in the electricity-to-light conversion structure and the light-to-electricity conversion layer in the light-to-electricity conversion structure respectively, if different numbers of electricity-to-light conversion structures and light-to-electricity conversion structures are connected in series at the input end and the output end respectively, a DC voltage transformation may be realized by a number ratio of the electricity-to-light conversion structures to the light-to-electricity conversion structures. In addition, the semiconductor DC transformer further has advantages of high voltage withstand, non-electromagnetic radiation, non-coil structure, safety and reliability, small volume, long lifetime, light weight, convenient installation and maintenance, etc.

In order to decrease a light loss and increase the light-to-electricity conversion efficiency, based on the embodiments shown in FIG. 3, the semiconductor DC transformer according to an embodiment of the present disclosure may further comprise a reflection layer located on a top of the electricity-to-light conversion layer and a reflection layer located on a top of the light-to-electricity conversion layer so as to allow the light to be confined in a device without leakage. According to different specific positions of the reflection layers, the semiconductor DC transformer may have a structure shown in FIG. 4 or FIG. 5.

Figure 4:
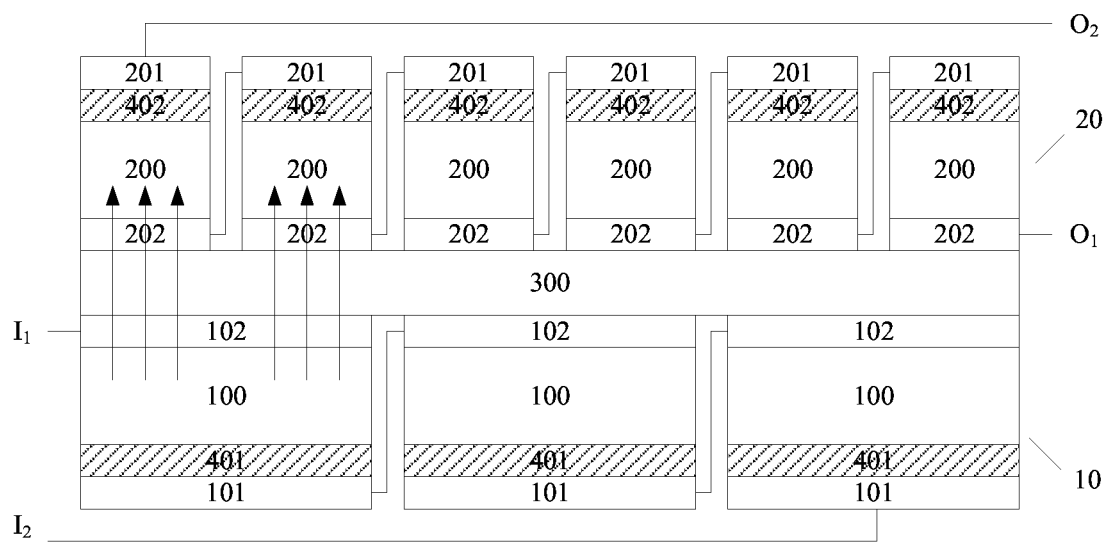
FIG. 4 is a cross-sectional view of a semiconductor DC transformer according to an embodiment of the present disclosure.

FIG. 4 is a cross-sectional view of a semiconductor DC transformer comprising the reflection layers according to an embodiment of the present disclosure. One of the reflection layers is located between each electricity-to-light conversion layer and a top contact layer thereof, and the other is located between each light-to-electricity conversion layer and a top contact layer thereof.

As shown in FIG. 4, compared with the embodiment shown in FIG. 3, a semiconductor DC transformer 2 further comprises: a first reflection layer 401 located between each electricity-to-light conversion layer 100 and each first contact layer 101, and a second reflection layer 402 located between each light-to-electricity conversion layer 200 and each third contact layer 201. The lights may be confined between the first reflection layers 401 and the second reflection layers 402 without leakage, thus increasing a conversion efficiency of each light-to-electricity conversion layer 200. Each first reflection layer 401 and each second reflection layer 402 should have features of conductivity and be energy band matched, because they are located between each first contact layer 101 and each third contact layer 201. Thus, a semiconductor material with a Bragg reflector structure similar to that of each electricity-to-light conversion layer 100 or each light-to-electricity conversion layer 200 may be used to form each first reflection layer 401 or each second reflection layer 402 so as to reflect light. Moreover, because each first contact layer 101 and each third contact layer 201 are not required to be transparent to the working light, each of each first contact layer 101 and each third contact layer 201 may be a single layer and/or a multi-layer composite structure formed by a metal, an alloy, a conductive oxide, a heavily doped semiconductor, etc. to reduce the resistance.

Figure 5:
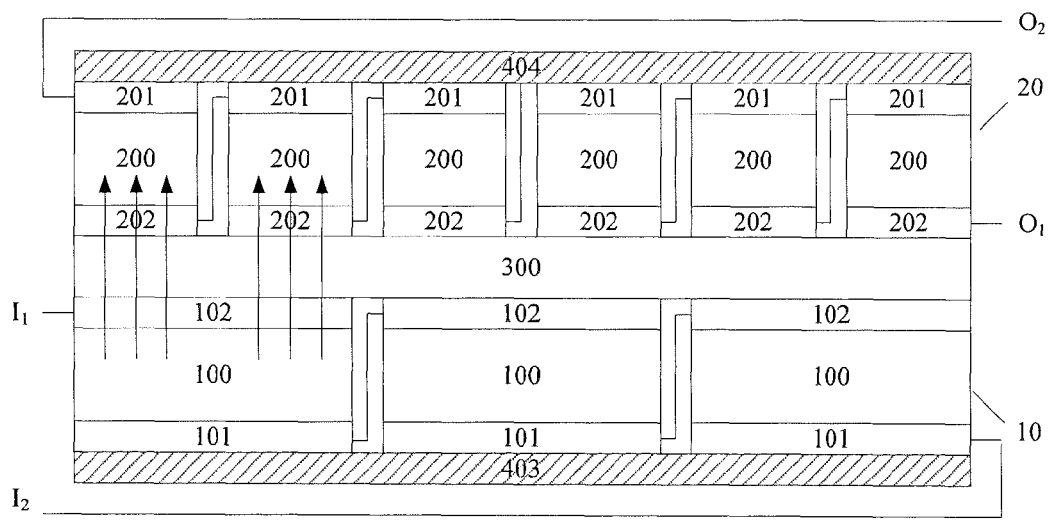
FIG. 5 is a cross-sectional view of a semiconductor DC transformer according to an embodiment of the present disclosure.

FIG. 5 is a cross-sectional view of a semiconductor DC transformer comprising the reflection layers according to an embodiment of the present disclosure. One of the reflection layers is located on tops of the plurality of semiconductor electricity-to-light conversion structures 10, and the other is located on tops of the plurality of semiconductor light-to-electricity conversion structures 20.

As shown in FIG. 5, compared with the embodiment shown in FIG. 3, a semiconductor DC transformer 3 further comprises: a third reflection layer 403 located on the tops of the plurality of semiconductor electricity-to-light conversion structures 10, and a fourth reflection layer 404 located on the tops of the plurality of semiconductor light-to-electricity conversion structures 20. In other words, the third reflection layer 403 is located on the tops of the plurality of first contact layers 101, and the fourth reflection layer 404 is located on the tops of the plurality of third contact layers 201. The lights may be confined between the third reflection layer 403 and the fourth reflection layer 404 without leakage, thus increasing the conversion efficiency of each light-to-electricity conversion layer 200. If the third reflection layer 403 and the fourth reflection layer 404 are each used as an integral reflection layer, the third reflection layer 403 and the fourth reflection layer 404 need to be insulated, and thus an insulating material such as REO with a Bragg reflector structure may be used to form the third reflection layer 403 or the fourth reflection layer 404. If the third reflection layer 403 and the fourth reflection layer 404 are a plurality of reflection layers distributed on tops of the plurality of structure units, i.e., the plurality of semiconductor electricity-to-light conversion structures 10 and the plurality of semiconductor light-to-electricity conversion structures 20, respectively, a metal, an alloy and other conductive materials with an omnidirectional reflector structure may also be used to form the third reflection layer 403 or the fourth reflection layer 404. Moreover, at this time, because each first contact layer 101 and each third contact layer 201 need to be transparent to the working light, the material of each of each first contact layer 101 and each third contact layer 201 may be any one of a heavily doped and wide bandgap semiconductor material, for example, GaAs, GaN, AlGaInP, AlGaInN, or AlGaInAs; a conductive transparent metal oxide, for example, ITO, $SnO_2$, or ZnO; graphene; and a combination thereof.

Figure 6:
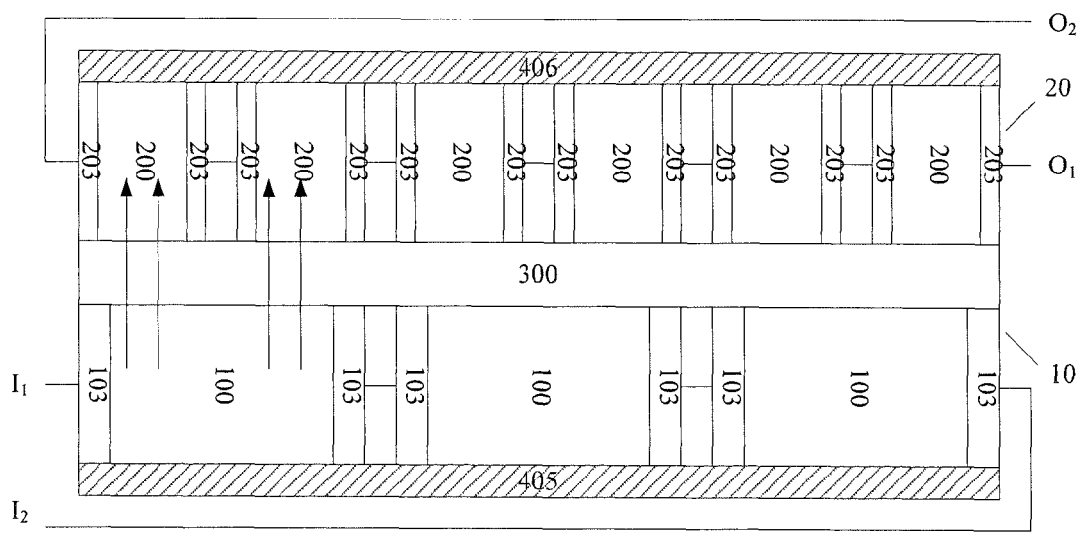
FIG. 6 is a cross-sectional view of a semiconductor DC transformer according to an embodiment of the present disclosure.

In one embodiment, the contact layers of electrodes may also be formed on both sides of each semiconductor electricity-to-light conversion structure 10 and each semiconductor light-to-electricity conversion structure 20 respectively, as shown in FIG. 6.

As shown in FIG. 6, a semiconductor DC transformer 4 comprises: the plurality of semiconductor electricity-to-light conversion structures 10 connected in series, the plurality of semiconductor light-to-electricity conversion structures 20 connected in series and the insulation layer 300. Each semiconductor electricity-to-light conversion structure 10 comprises the electricity-to-light conversion layer 100 and a fifth contact layer 103 located on each side of each semiconductor electricity-to-light conversion structure 10. Each semiconductor light-to-electricity conversion structure 20 comprises the light-to-electricity conversion layer 200 and a sixth contact layer 203 located on each side of each semiconductor light-to-electricity conversion structure 20. The working light spectrum of the semiconductor electricity-to-light conversion structures 10 is matched with that of the semiconductor light-to-electricity conversion structures 20. The insulation layer 300 is transparent to the working light. In order to obtain a higher energy conversion efficiency, preferably, the semiconductor DC transformer 4 may further comprise: a fifth reflection layer 405 located on the top of each electricity-to-light conversion layer 100 and a sixth reflection layer 406 located on the top of each light-to-electricity conversion layer 200. The fifth reflection layer 405 and the sixth reflection layer 406 need to be insulated, and thus an insulating material such as REO with a Bragg reflector structure may be used to form the fifth reflection layer 405 and the sixth reflection layer 406.

Figure 7:
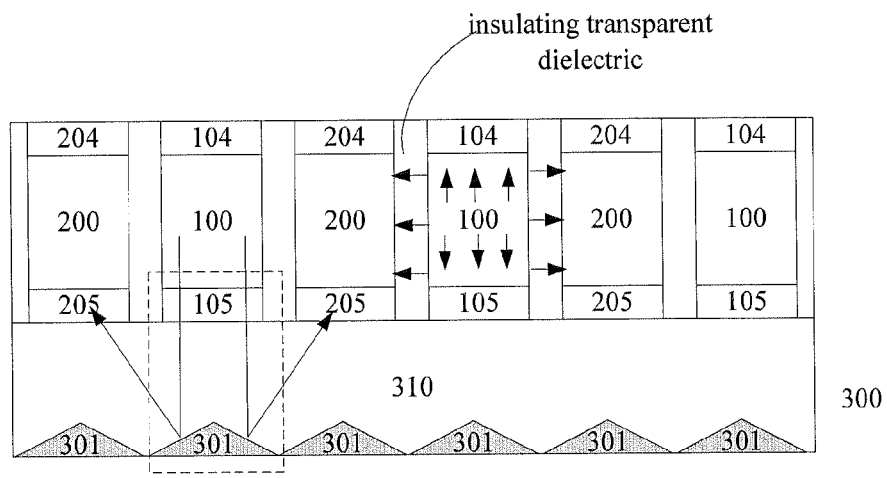
FIG. 7 is a cross-sectional view of a semiconductor DC transformer according to an embodiment of the present disclosure.

In another embodiment, each semiconductor electricity-to-light conversion structure 10 and each semiconductor light-to-electricity conversion structure 20 may be located on a same side of the insulation layer or a substrate layer 300, as shown in FIG. 7.

Figure 8:
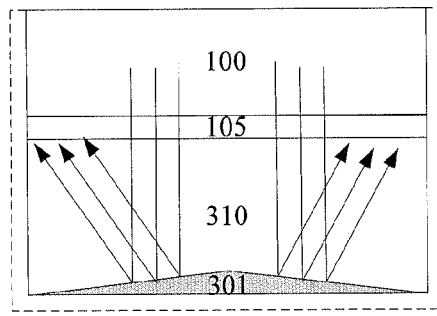
FIG. 8 is an enlarged cross-sectional view of an inverted triangular reflection mirror structure on an upper surface of a light-to-electricity conversion layer shown in FIG. 7.

As shown in FIG. 7, a semiconductor DC transformer 5 comprises: the plurality of semiconductor electricity-to-light conversion structures 10 connected in series, the plurality of semiconductor light-to-electricity conversion structures 20 connected in series and the substrate layer 300. The working light spectrum of the plurality of semiconductor electricity-to-light conversion structures 10 connected in series is matched with that of the plurality of semiconductor light-to-electricity conversion structures 20 connected in series. The plurality of semiconductor electricity-to-light conversion structures 10 and the plurality of semiconductor light-to-electricity conversion structures 20 are arranged alternately on a same surface of the substrate layer 300 (such as a top of the substrate layer 300). An insulating transparent dielectric for electrical isolation is filled between the plurality of semiconductor electricity-to-light conversion structures 10 and the plurality of semiconductor light-to-electricity conversion structures 20. Each semiconductor light-to-electricity conversion structure 10 comprises: the electricity-to-light conversion layer 100, a seventh contact layer 104 located on a top of each electricity-to-light conversion layer 100, and an eighth contact layer 105 located on a bottom of each electricity-to-light conversion layer 100. The eighth contact layer 105 is transparent to the working light. Each semiconductor light-to-electricity conversion structure 20 comprises: the light-to-electricity conversion layer 200, a ninth contact layer 204 located on a top of each light-to-electricity conversion layer 200, and a tenth contact layer 205 located on a bottom of each light-to-electricity conversion layer 200. The tenth contact layer 205 is transparent to the working light. The substrate layer 300 comprises a transparent insulating dielectric layer 310 and a reflection layer 301. A material of the transparent insulating dielectric layer 310 may be a solid transparent insulating material or a liquid or gaseous transparent insulating material enclosed in a shell for providing a space for the light transmission. The reflection layer 301 may be a triangular reflection structure for allowing a longitudinal transmission light emitted by each electricity-to-light conversion layer 100 to be reflected by an inclined plane of the reflection layer 301 to turn to each light-to-electricity conversion layer 200, as shown in FIG. 8. In one preferred embodiment, the semiconductor DC transformer 5 may further comprise a top reflection layer located on a top of the semiconductor DC transformer 5. Similar to the reflection layer 301, the top reflection layer may have an inverted triangular reflection structure for allowing the transmission direction change of the longitudinal transmission light.

In another embodiment, in addition to emitting light longitudinally as described above, each electricity-to-light conversion layer 100 may also emit light transversely. When each electricity-to-light conversion layer 100 emits light transversely, a simple design is that the plurality of semiconductor electricity-to-light conversion structures 10 and the plurality of semiconductor light-to-electricity conversion structures 20 are arranged alternately on the same surface of the substrate layer 300. In addition, the reflection layers disposed on two opposite surfaces of each electricity-to-light conversion layer 100 and each light-to-electricity conversion layer 200 may confine the light in a certain region to avoid the energy loss caused by the light leakage. According to different specific positions of the reflection layers, the semiconductor DC transformer may have a structure shown in FIG. 9 or FIG. 10.

Figure 9:
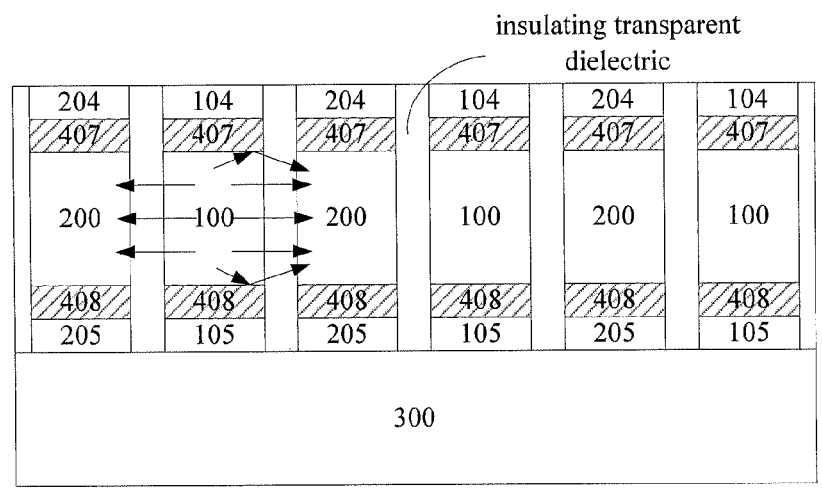
FIG. 9 is a cross-sectional view of a semiconductor DC transformer according to an embodiment of the present disclosure.

FIG. 9 is a cross-sectional view of a semiconductor DC transformer according to an embodiment of the present disclosure.

As shown in FIG. 9, a semiconductor DC transformer 6 comprises: the plurality of semiconductor electricity-to-light conversion structures 10 connected in series, the plurality of semiconductor light-to-electricity conversion structures 20 connected in series and the substrate layer 300 for supporting. The working light spectrum of the plurality of semiconductor electricity-to-light conversion structures 10 connected in series is matched with that of the plurality of semiconductor light-to-electricity conversion structures 20 connected in series. The plurality of semiconductor electricity-to-light conversion structures 10 and the plurality of semiconductor light-to-electricity conversion structures 20 are arranged alternately on a top surface of the substrate layer 300. The insulating transparent dielectric for electrical isolation is filled between the plurality of semiconductor electricity-to-light conversion structures 10 and the plurality of semiconductor light-to-electricity conversion structures 20. Each semiconductor light-to-electricity conversion structure 10 comprises: the electricity-to-light conversion layer 100, a seventh contact layer 104 located on the top of each electricity-to-light conversion layer 100, and an eighth contact layer 105 located on the bottom of each electricity-to-light conversion layer 100. Each semiconductor light-to-electricity conversion structure 20 comprises: the light-to-electricity conversion layer 200, a ninth contact layer 204 located on the top of each light-to-electricity conversion layer 200, and a tenth contact layer 205 located on the bottom of each light-to-electricity conversion layer 200. The semiconductor DC transformer 6 may further comprise: a seventh reflection layer 407 located between each electricity-to-light conversion layer 100 and the seventh contact layer 104 and between each light-to-electricity conversion layer 200 and the ninth contact layer 204, and an eighth reflection layer 408 located between each electricity-to-light conversion layer 100 and the eighth contact layer 105 and between each light-to-electricity conversion layer 200 and the tenth contact layer 205. The lights may be confined between the seventh reflection layers 407 and the eighth reflection layers 408 without leakage, thus increasing the conversion efficiency of each light-to-electricity conversion layer 200. Each seventh reflection layer 407 and each eighth reflection layer 408 should have features of conductivity and be energy band matched, because they are located between each seventh contact layer 104 and each eighth contact layer 105 and between each ninth contact layer 204 and each tenth contact layer 205. Thus, a semiconductor material with a Bragg reflector structure similar to that of each electricity-to-light conversion layer 100 or each light-to-electricity conversion layer 200 may be used to form each seventh reflection layer 407 and each eighth reflection layer 408 so as to reflect light. Moreover, because each seventh contact layer 104, each eighth contact layer 105, each ninth contact layer 204 and each tenth contact layer 205 are not required to be transparent to the working light, each of each seventh contact layer 104, each eighth contact layer 105, each ninth contact layer 204 and each tenth contact layer 205 may be a single layer and/or a multi-layer composite structure formed by a metal, an alloy, a conductive oxide, a heavily doped semiconductor, etc. to reduce the resistance.

Figure 10:
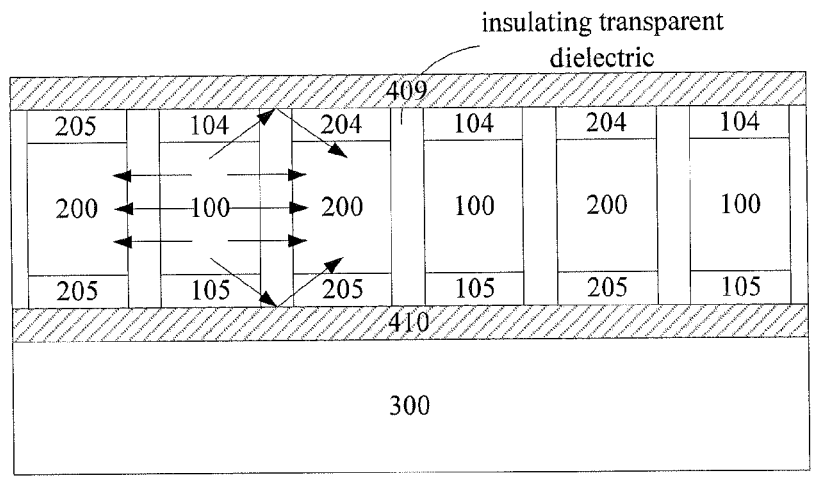
FIG. 10 is a cross-sectional view of a semiconductor DC transformer according to an embodiment of the present disclosure.

FIG. 10 is a cross-sectional view of a semiconductor DC transformer according to an embodiment of the present disclosure.

As shown in FIG. 10, a semiconductor DC transformer 7 comprises: the plurality of semiconductor electricity-to-light conversion structures 10 connected in series, the plurality of semiconductor light-to-electricity conversion structures 20 connected in series and the substrate layer 300 for supporting. The working light spectrum of the plurality of semiconductor electricity-to-light conversion structures 10 connected in series is matched with that of the plurality of semiconductor light-to-electricity conversion structures 20 connected in series. The plurality of semiconductor electricity-to-light conversion structures 10 and the plurality of semiconductor light-to-electricity conversion structures 20 are arranged alternately on a top surface of the substrate layer 300. The insulating transparent dielectric for electrical isolation is filled between the plurality of semiconductor electricity-to-light conversion structures 10 and the plurality of semiconductor light-to-electricity conversion structures 20. Each semiconductor light-to-electricity conversion structure 10 comprises: the electricity-to-light conversion layer 100, a seventh contact layer 104 located on the top of each electricity-to-light conversion layer 100, and an eighth contact layer 105 located on the bottom of each electricity-to-light conversion layer 100. Each semiconductor light-to-electricity conversion structure 20 comprises: the light-to-electricity conversion layer 200, a ninth contact layer 204 located on the top of each light-to-electricity conversion layer 200, and a tenth contact layer 205 located on the bottom of each light-to-electricity conversion layer 200. The semiconductor DC transformer 7 may further comprise: a ninth reflection layer 409 located on tops of the seventh contact layer 104 and the ninth contact layer 204, and a tenth reflection layer 410 located on bottoms of the eighth contact layer 105 and the tenth contact layer 410. The lights may be confined between the ninth reflection layer 409 and the tenth reflection layer 410 without leakage, thus increasing the conversion efficiency of each light-to-electricity conversion layer 200. If the ninth reflection layer 409 and the tenth reflection layer 410 are each used as an integral reflection layer, the ninth reflection layer 409 and the tenth reflection layer 410 need to be insulated, and thus an insulating material such as REO with a Bragg reflector structure may be used to form the ninth reflection layer 409 or the tenth reflection layer 410. If the ninth reflection layer 409 and the tenth reflection layer 410 are a plurality of reflection layers distributed on tops of the plurality of structure units, i.e., the plurality of semiconductor electricity-to-light conversion structures 10 and the plurality of semiconductor light-to-electricity conversion structures 20, respectively, a metal, an alloy and other conductive materials with an omnidirectional reflector structure may also be used to form the ninth reflection layer 409 or the tenth reflection layer 410. Moreover, at this time, because each seventh contact layer 104, each eighth contact layer 105, each ninth contact layer 204 and each tenth contact layer 205 need to be transparent to the working light, the material of each of each seventh contact layer 104, each eighth contact layer 105, each ninth contact layer 204 and each tenth contact layer 205 may be any one of a heavily doped and wide bandgap semiconductor material, for example, GaAs, GaN, AlGaInP, AlGaInN, or AlGaInAs; a conductive transparent metal oxide, for example, ITO, $SnO_2$, or ZnO; graphene; and a combination thereof.

Figure 11:
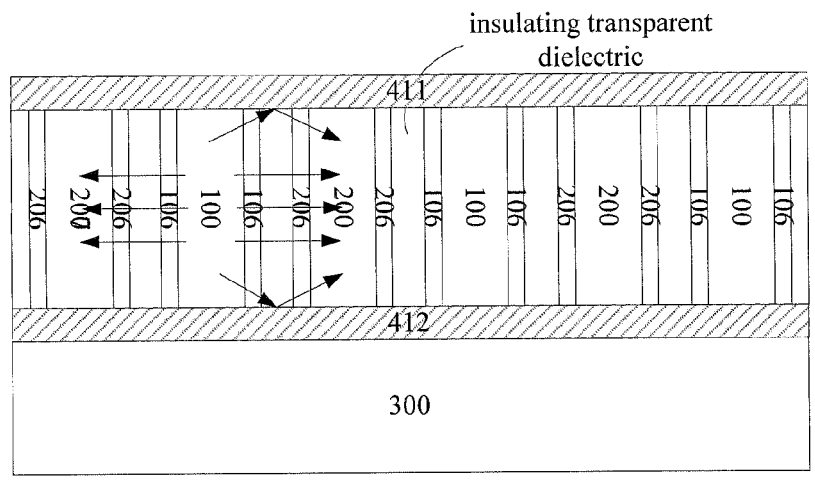
FIG. 11 is a cross-sectional view of a semiconductor DC transformer according to an embodiment of the present disclosure.

FIG. 11 is a cross-sectional view of a semiconductor DC transformer according to an embodiment of the present disclosure.

As shown in FIG. 11, a semiconductor DC transformer 8 comprises: the plurality of semiconductor electricity-to-light conversion structures 10 connected in series, the plurality of semiconductor light-to-electricity conversion structures 20 connected in series and the substrate layer 300. The working light spectrum of the plurality of semiconductor electricity-to-light conversion structures 10 connected in series is matched with that of the plurality of semiconductor light-to-electricity conversion structures 20 connected in series. The plurality of semiconductor electricity-to-light conversion structures 10 and the plurality of semiconductor light-to-electricity conversion structures 20 are arranged alternately on a top surface of the substrate layer 300. The insulating transparent dielectric for electrical isolation is filled between the plurality of semiconductor electricity-to-light conversion structures 10 and the plurality of semiconductor light-to-electricity conversion structures 20. Each semiconductor light-to-electricity conversion structure 10 comprises: the electricity-to-light conversion layer 100, and an eleventh contact layer 106 formed on each side of each electricity-to-light conversion layer 100. Each semiconductor light-to-electricity conversion structure 20 comprises: the light-to-electricity conversion layer 200, and a twelfth contact layer 206 formed on each side of each light-to-electricity conversion layer 200. The semiconductor DC transformer 8 may further comprise: an eleventh reflection layer 411 located on tops of the electricity-to-light conversion layer 100 and the light-to-electricity conversion layer 200; and a twelfth reflection layer 412 located on bottoms of the electricity-to-light conversion layer 100 and the light-to-electricity conversion layer 200. The lights may be confined between the eleventh reflection layer 411 and the twelfth reflection layer 412 without leakage, thus increasing the conversion efficiency of each light-to-electricity conversion layer 200. The eleventh reflection layer 411 and the twelfth reflection layer 412 need to be insulated, and thus an insulating material such as REO with a Bragg reflector structure may be used to form the eleventh reflection layer 411 or the twelfth reflection layer 412. Moreover, at this time, because each eleventh contact layer 106 and each twelfth contact layer 206 need to be transparent to the working light, the material of each of each eleventh contact layer 106 and each twelfth contact layer 206 may be any one of a heavily doped and wide bandgap semiconductor material, for example, GaAs, GaN, AlGaInP, AlGaInN, or AlGaInAs; a conductive transparent metal oxide, for example, ITO, $SnO_2$, or ZnO; graphene; and a combination thereof.

Figure 12:
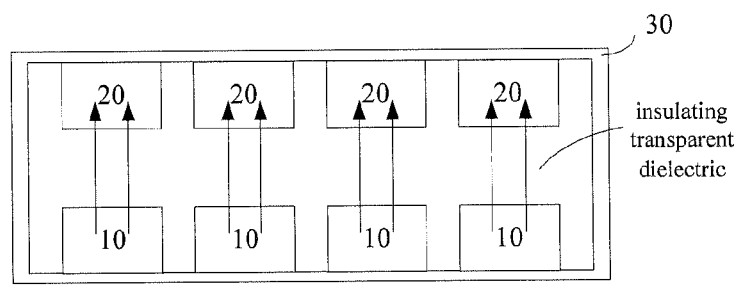
FIG. 12 is a cross-sectional view of a semiconductor DC transformer according to an embodiment of the present disclosure.

FIG. 12 is a cross-sectional view of a semiconductor DC transformer according to an embodiment of the present disclosure.

As shown in FIG. 12, a semiconductor DC transformer 9 comprises: the plurality of semiconductor electricity-to-light conversion structures 10 connected in series, the plurality of semiconductor light-to-electricity conversion structures 20 connected in series and a shell 30. The working light spectrum of the plurality of semiconductor electricity-to-light conversion structures 10 connected in series is matched with that of the plurality of semiconductor light-to-electricity conversion structures 20 connected in series. The plurality of semiconductor electricity-to-light conversion structures 10 and the plurality of semiconductor light-to-electricity conversion structures 20 are formed on two inner opposite surfaces of the shell 30 respectively, and a liquid transparent insulating dielectric or a gaseous transparent insulating dielectric is filled in the shell 30. A mirror reflector may be set on the inner surface of the shell 30.

Although explanatory embodiments have been shown and described, it would be appreciated by those skilled in the art that changes, alternatives, and modifications may be made in the embodiments without departing from spirit and principles of the disclosure. Such changes, alternatives, and modifications all fall into the scope of the claims and their equivalents.

What is claimed is:

1. A semiconductor DC transformer, comprising:
    a plurality of semiconductor electricity-to-light conversion structures connected in series for converting input electric energy into optical energy;
    a plurality of semiconductor light-to-electricity conversion structures connected in series for converting input optical energy into electric energy; and
    an insulation layer located between and contacting with each of the semiconductor electricity-to-light conversion structures and each of the semiconductor light-to-electricity conversion structures, and comprising a solid transparent insulating dielectric,
    wherein a number of the semiconductor electricity-to-light conversion structures is different from that of the semiconductor light-to-electricity conversion structures so as to realize a DC transformation.

2. The semiconductor DC transformer according to claim 1, wherein each semiconductor electricity-to-light conversion structure comprises a light emitting diode structure, a resonant cavity light emitting diode structure, or a laser diode structure.

3. The semiconductor DC transformer according to claim 1, wherein each semiconductor electricity-to-light conversion structure comprises a plurality of semiconductor electricity-to-light conversion units connected in parallel, or each semiconductor light-to-electricity conversion structure comprises a plurality of semiconductor light-to-electricity conversion units connected in parallel.

4. The semiconductor DC transformer according to claim 1,
wherein the plurality of semiconductor electricity-to-light conversion structures are formed on one side of the insulation layer, each semiconductor electricity-to-light conversion structure comprises an electricity-to-light conversion layer, the plurality of semiconductor light-to-electricity conversion structures are formed on the other side of the insulation layer, each semiconductor light-to-electricity conversion structure comprises an light-to-electricity conversion layer, and the insulation layer is transparent to a working light emitted by the electricity-to-light conversion layer.

5. The semiconductor DC transformer according to claim 4, wherein refractive indices of materials of each semiconductor electricity-to-light conversion layer, the insulation layer and each semiconductor light-to-electricity conversion layer are matched with each other.

6. The semiconductor DC transformer according to claim 4, wherein
refractive indices of materials of each semiconductor electricity-to-light conversion layer, the insulation layer and each semiconductor light-to-electricity conversion layer are approximately equal; or
$n_{each\ electricity\text{-}to\text{-}light\ conversion\ layer} < n_{the\ insulation\ layer} < n_{each\ light\text{-}to\text{-}electricity\ conversion\ layer}$, where $n_{each\ electricity\text{-}to\text{-}light\ conversion\ layer}$ is a refractive index of each semiconductor electricity-to-light conversion layer, $n_{the\ insulation\ layer}$ is a refractive index of the insulation layer, and $n_{each\ light\text{-}to\text{-}electricity\ conversion\ layer}$ is a refractive index of each semiconductor light-to-electricity conversion layer.

7. The semiconductor DC transformer according to claim 4, further comprising:
a first contact layer located on a top of each electricity-to-light conversion layer, a second contact layer located on a bottom of each electricity-to-light conversion layer, a third contact layer located on a top of each light-to-electricity conversion layer, and a fourth contact layer located on a bottom of each light-to-electricity conversion layer, wherein the second contact layer and the fourth contact layer are transparent to the working light emitted by the electricity-to-light conversion layer.

8. The semiconductor DC transformer according to claim 7, further comprising:
a first reflection layer located between each electricity-to-light conversion layer and the first contact layer, and a second reflection layer located between each light-to-electricity conversion layer and the third contact layer; or
a third reflection layer located on a top of the first contact layer, and a fourth reflection layer located on a top of the third contact layer.

9. The semiconductor DC transformer according to claim 1, further comprising:
a substrate layer,
wherein the plurality of semiconductor light-to-electricity conversion structures and the plurality of semiconductor electricity-to-light conversion structures are formed on the substrate layer, each semiconductor light-to-electricity conversion structure has a light-to-electricity conversion layer, each semiconductor electricity-to-light conversion structure has an electricity-to-light conversion layer, and an insulating transparent dielectric is filled between the plurality of semiconductor light-to-electricity conversion structures and the plurality of semiconductor electricity-to-light conversion structures.

10. The semiconductor DC transformer according to claim 9, further comprising:
a seventh contact layer located on a top of each electricity-to-light conversion layer, an eighth contact layer located on a bottom of each electricity-to-light conversion layer, a ninth contact layer located on a top of each light-to-electricity conversion layer, and a tenth contact layer located on a bottom of each light-to-electricity conversion layer, wherein the eighth contact layer and the tenth contact layer are transparent to the working light emitted by the electricity-to-light conversion layer.

11. The semiconductor DC transformer according to claim 10, wherein a material of each of the second contact layer, the fourth contact layer, the eighth contact layer and the tenth contact layer comprises any one of a heavily doped semiconductor material, a transparent conductive oxide, graphene and a combination thereof.

12. The semiconductor DC transformer according to claim 11, further comprising:
a seventh reflection layer located between each electricity-to-light conversion layer and the seventh contact layer and between each light-to-electricity conversion layer and the ninth contact layer, and an eighth reflection layer located between each electricity-to-light conversion layer and the eighth contact layer and between each light-to-electricity conversion layer and the tenth contact layer; or
a ninth reflection layer located on tops of the seventh contact layer and the ninth contact layer, and a tenth reflection layer located on bottoms of the eighth contact layer and the tenth contact layer.

13. The semiconductor DC transformer according to claim 9, further comprising:
an eleventh contact layer formed on each side of each electricity-to-light conversion layer; and
a twelfth contact layer formed on each side of each light-to-electricity conversion layer.

14. The semiconductor DC transformer according to claim 13, further comprising:
an eleventh reflection layer located on tops of the electricity-to-light conversion layer and the light-to-electricity conversion layer; and
a twelfth reflection layer located on bottoms of the electricity-to-light conversion layer and the light-to-electricity conversion layer.

15. The semiconductor DC transformer according to claim 4, wherein a material of the electricity-to-light conversion layer is a nitride compound, an arsenide compound or a phosphide compound semiconductor material in groups III-V, including any one of AlGaInP in a red-to-yellow wavelength range; GaN and InGaN in an ultraviolet wavelength range; InGaN, AlGaInN, and ZnO in a blue-to-violet wavelength range; AlGaInAs, GaAS, InGaAs, InGaAsP, AlGaAs, and InGaAsNSb in a red wavelength range or an infrared wavelength range; and a combination thereof.

16. The semiconductor DC transformer according to claim 4, wherein a material of the light-to-electricity conversion layer comprises any one of Si, Ge, SiGe, AlGaInP, InGaAs, InGaN, AlGaInN, InGaAsP, GaAs, GaSb, InGaP, InGaAs, InGaAsP, AlGaAs, AlGaP, InAlP, AlGaAsSb, InGaAsNSb, other group III-V direct bandgap semiconductor materials, and a combination thereof.

17. The semiconductor DC transformer according to claim 7, wherein refractive indices of materials of each semiconductor electricity-to-light conversion layer, each second contact layer, the insulation layer, each fourth contact layer and each semiconductor light-to-electricity conversion layer are matched with each other.

18. The semiconductor DC transformer according to claim 7, wherein
refractive indices of materials of each semiconductor electricity-to-light conversion layer, each second contact layer, the insulation layer, each fourth contact layer and each semiconductor light-to-electricity conversion layer are approximately equal; or $n_{each\ electricity-to-light\ conversion\ layer} < n_{each\ second\ contact\ layer} < n_{the\ insulation\ layer} < n_{each\ fourth\ contact\ layer} < n_{each\ light-to-electricity\ conversion\ layer}$, where $n_{each\ electricity-to-light\ conversion\ layer}$ is a refractive index of each semiconductor electricity-to-light conversion layer, $n_{each\ second\ contact\ layer}$ is a refractive index of each second contact layer, $n_{the\ insulation\ layer}$ is a refractive index of the insulation layer, $n_{each\ fourth\ contact\ layer}$ is a refractive index of each fourth contact layer and $n_{each\ light-to-electricity\ conversion\ layer}$ is a refractive index of each semiconductor light-to-electricity conversion layer.

19. The semiconductor DC transformer according to claim 1, wherein a working light spectrum of the semiconductor electricity-to-light conversion structures is matched with that of the semiconductor light-to-electricity conversion structures.

* * * * *